United States Patent
Chindalore et al.

(10) Patent No.: US 7,432,547 B2
(45) Date of Patent: Oct. 7, 2008

(54) NON-VOLATILE MEMORY DEVICE WITH IMPROVED DATA RETENTION AND METHOD THEREFOR

(75) Inventors: Gowrishankar L. Chindalore, Austin, TX (US); Frank K. Baker, Jr., Austin, TX (US); Paul A. Ingersoll, Austin, TX (US); Alexander B. Hoefler, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 602 days.

(21) Appl. No.: 10/779,004

(22) Filed: Feb. 13, 2004

(65) Prior Publication Data

US 2004/0159881 A1 Aug. 19, 2004

Related U.S. Application Data

(62) Division of application No. 10/017,427, filed on Dec. 14, 2001, now abandoned.

(51) Int. Cl.
*H01L 21/8238* (2006.01)
(52) U.S. Cl. .................. 257/324; 257/316; 257/321; 257/E29.129
(58) Field of Classification Search .......... 257/314, 257/315, 321, 324, 611, 316, 318, 311, 330, 257/E29.129, E29.165, E29.309; 438/261, 438/262, 267
See application file for complete search history.

(56) References Cited

U.S. PATENT DOCUMENTS

| | | | |
|---|---|---|---|
| 5,644,152 A | 7/1997 | Rostoker | |
| 5,670,809 A | 9/1997 | Saitoh | |
| 5,866,930 A | 2/1999 | Saida | |
| 5,888,867 A | 3/1999 | Wang | |
| 5,998,264 A | 12/1999 | Wu | |
| 6,124,170 A | 9/2000 | Lim | |
| 6,133,605 A | 10/2000 | Kishi | |
| 6,140,676 A * | 10/2000 | Lancaster | 257/315 |
| 6,153,470 A * | 11/2000 | He et al. | 438/257 |
| 6,191,445 B1 * | 2/2001 | Fujiwara | 257/321 |
| 6,441,464 B1 * | 8/2002 | Holmes et al. | 257/616 |
| 6,455,890 B1 * | 9/2002 | Chang et al. | 257/321 |
| 6,693,830 B1 * | 2/2004 | Hu et al. | 365/185.28 |
| 6,750,102 B1 * | 6/2004 | Lancaster | 438/261 |
| 6,753,572 B2 * | 6/2004 | Lee et al. | 257/324 |
| 6,812,515 B2 * | 11/2004 | Rabkin et al. | 257/315 |
| 2001/0021549 A1 | 9/2001 | Keller | |
| 2001/0030340 A1 * | 10/2001 | Fujiwara | 257/314 |

* cited by examiner

*Primary Examiner*—Sue A. Purvis
*Assistant Examiner*—Fazli Erdem
(74) *Attorney, Agent, or Firm*—Daniel D. Hill

(57) ABSTRACT

A semiconductor device (30) comprises an underlying insulating layer (34), an overlying insulating layer (42) and a charge storage layer (36) between the insulating layers (34, 42). The charge storage layer (36) and the overlying insulating layer (42) form an interface, where at least a majority of charge in the charge storage layer (36) is stored. This can be accomplished by forming a charge storage layer (36) with different materials such as silicon and silicon germanium layers or n-type and p-type material layers, in one embodiment. In another embodiment, the charge storage layer (36) comprises a dopant that is graded. By storing at least a majority of the charge at the interface between the charge storage layer (36) and the overlying insulating layer (42), the leakage of charge through the underlying insulating layer is decreased allowing for a thinner underlying insulating layer (34) to be used.

6 Claims, 2 Drawing Sheets

NON-VOLATILE MEMORY DEVICE WITH IMPROVED DATA RETENTION AND METHOD THEREFOR

CROSS-REFERENCE TO RELATED APPLICATIONS

This application is a divisional application of U.S. application Ser. No. 10/017,427 filed Dec. 14, 2001, currently abandoned.

FIELD OF THE INVENTION

The present invention relates generally to semiconductor devices, and more particularly, to a semiconductor device having a floating gate transistor with improved data retention and method therefor.

BACKGROUND OF THE INVENTION

One type of non-volatile integrated circuit memory uses a floating gate transistor for charge storage. Charge stored on the floating gate is used to manipulate a threshold voltage of the transistor, and in this manner store data. An array of floating gate transistors is included with high voltage program/erase circuitry to form the non-volatile memory. While modern processing techniques allow the floating gate transistors to be made smaller, the high voltage program/erase circuits still require a relatively large surface area because they must be able to withstand the high program/erase voltages, for example about 10 volts. One way to reduce the high voltages necessary for program and erase operations is to make the tunnel oxide of the floating gate transistor thinner. However, reducing the thickness of the tunnel oxide may create data retention problems because electrons stored on the floating gate can leak through the relatively thinner tunnel oxide more easily.

Therefore there is a need for a floating gate transistor having good data retention capabilities while also having a thinner tunnel oxide and lower program/erase voltages.

DETAILED DESCRIPTION

Generally, the present invention provides a floating gate transistor having a tunnel oxide layer, a floating gate, a dielectric layer, and a control gate, where most of the electrons stored on the floating gate reside away from the tunnel oxide and substantially at an interface between the floating gate and the dielectric layer. By moving the electrons away from the tunnel oxide, fewer electrons will leak across the tunnel oxide thus improving data retention. Also, a thinner tunnel oxide may be used, resulting in a lower program/erase voltage. The use of a lower program/erase voltage allows smaller program/erase circuits, a smaller integrated circuit, and lower manufacturing costs.

Figure 1:
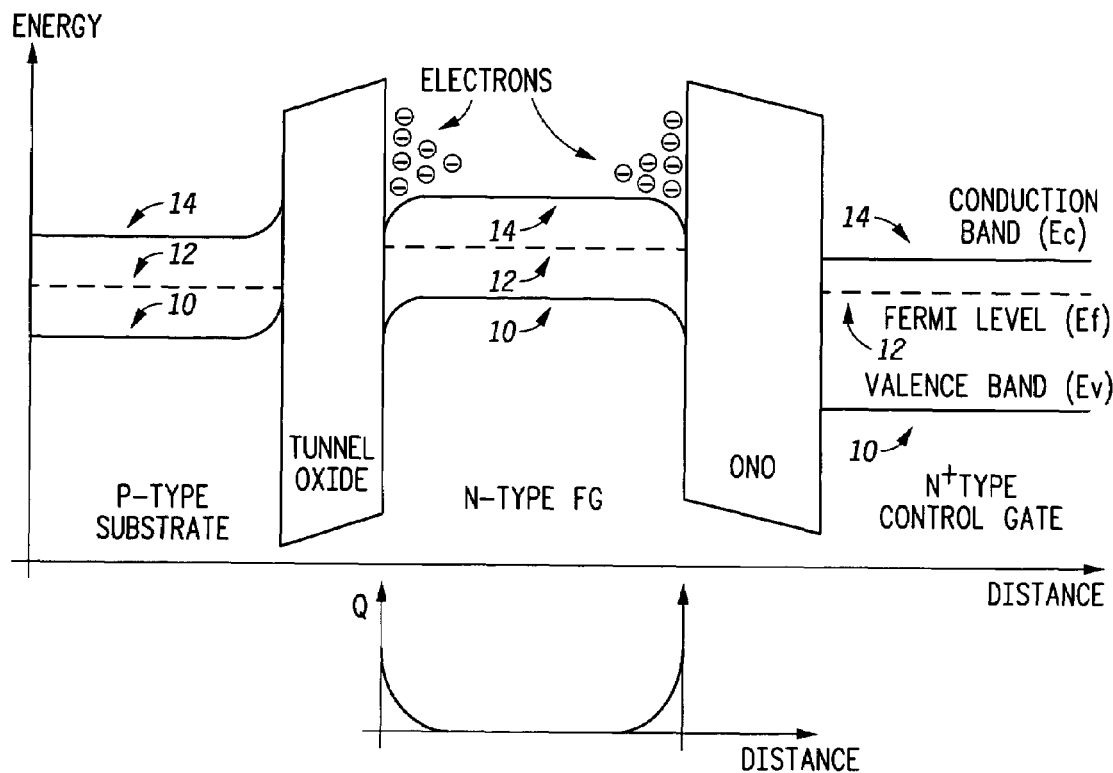
FIG. 1 is a graph illustrating charge storage in a prior art floating gate transistor.

FIG. 1 is a graph illustrating charge storage in a floating gate transistor in accordance with the prior art. FIG. 1 includes a valence band 10, Fermi level 12, and a conduction band 14 plotted with energy on a y-axis versus distance through the transistor on an x-axis. In a prior art floating gate transistor memory cell, there is typically a p-type substrate, a tunnel oxide, an n-type floating gate, a dielectric layer comprising an ONO structure and an n+type control gate. The graph of FIG. 1 is useful for showing the energy bands in the prior art floating gate transistor. During programming, electrons are moved onto the floating gate by one of several techniques, such as for example, Fowler-Nordheim tunneling or hot carrier injection. When storing charge, electrons tend to reside on the floating gate where conduction band 14 has the lowest energy. The valence band 10 indicates the energy for holes in the device and conduction band 14 indicates the energy for the electrons. The Fermi level 12 shows the electro-chemical potential of the holes and electrons in the device. Where the Fermi level 12 is relatively closer to the conduction band 14, electrons are more likely to reside. In the prior art structure, as can be seen by conduction band 14, the lowest energy is at the interface between the tunnel oxide and the floating gate and the interface between the floating gate and the dielectric layer. More electrons, and therefore higher charge is stored at the edges, or interfaces on the top and bottom of the floating gate. A graph of charge versus distance is shown below the floating gate in FIG. 1 to further illustrate charge storage at the interfaces. Electrons located at the interface between the tunnel oxide and the floating gate can leak through the tunnel oxide causing the programmed threshold of the floating gate to be reduced. This can cause loss of data and failure of the memory.

Figure 2:
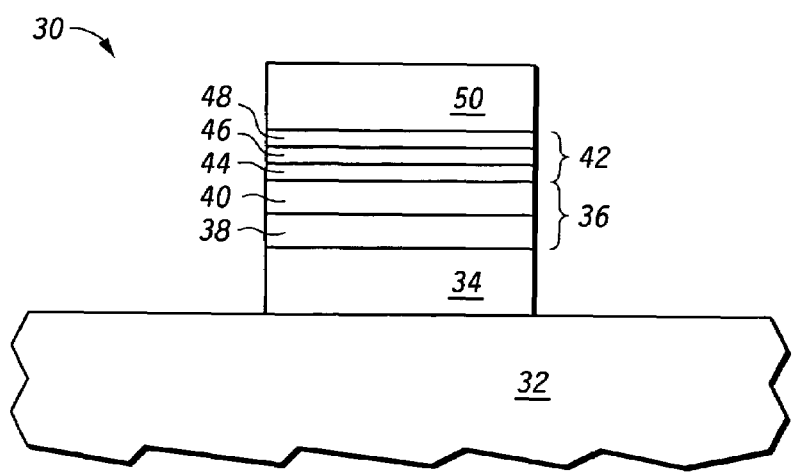
FIG. 2 illustrates a cross-section of a floating gate transistor in accordance with an embodiment of the present invention.

FIG. 2 illustrates a cross-section of a floating gate transistor 30 in accordance with an embodiment of the present invention. Floating gate transistor 30 includes substrate 32, tunnel oxide 34, floating gate 36, dielectric layer 42, and control gate 50. Floating gate 36 includes a first layer 38 and a second layer 40. Substrate 32 is a p-type semiconductor material in the illustrated embodiment. Tunnel oxide 34 is deposited on substrate 32 to a thickness of between 50 and 100 angstroms. Tunnel oxide 34 can be a conventional silicon dioxide ($SiO_2$) layer. In other embodiments tunnel oxide 34 may be any other dielectric that can confine the electrons on the floating gate, such as for example, silicon oxynitride (SiON).

Floating gate 36 is formed over tunnel oxide 34. Floating gate 36 includes a layer 38 and a layer 40. Layer 38 is formed directly over tunnel oxide 34. Layer 40 is formed directly over layer 38. The layers are each constructed of materials that cause more of the stored charge to reside in layer 40 than in layer 38. In one embodiment, layer 38 is formed from lightly doped n-type polysilicon, and layer 40 is formed from n-type polysilicon and germanium. Layer 38 and layer 40 are each about 500 Angstroms thick, thus making floating gate 36 about 1000 Angstroms thick. Note that in other embodiments, the thickness of each layer may be different. Also, in another embodiment, layer 38 can include p-type polysilicon and layer 40 can include n-type polysilicon. In addition, in another embodiment, layer 38 can be relatively lightly doped and layer 40 can be relatively more heavily doped. Further, in another embodiment, layer 38 can include a depletion region and layer 40 can include an accumulation region. The accumulation region stores a greater concentration of charge than the depletion region. In one embodiment, the depletion region stores substantially no charge. Also, in the illustrated embodiment the stored charge is electrons. In another embodiment, the stored charge may be holes. In yet another embodiment, the stored charge can be ionized impurities, such as locally fixed ionized donor impurities or ionized acceptor impurities. In the case where the stored charge is holes, one skilled in the art would recognize that doping concentrations and conductivity types would be different.

Dielectric layer 42 is formed over floating gate 36. Dielectric layer 42 is an oxide-nitride-oxide (ONO) structure and includes oxide layer 44, nitride layer 46 and oxide layer 48. In other embodiments, dielectric layer 42 can be any other dielectric that can confine the electrons on the floating gate such as SiON. Control gate 50 is formed from n+type polysilicon on dielectric layer 42 but can be formed from other conventional gate materials.

Figure 3:
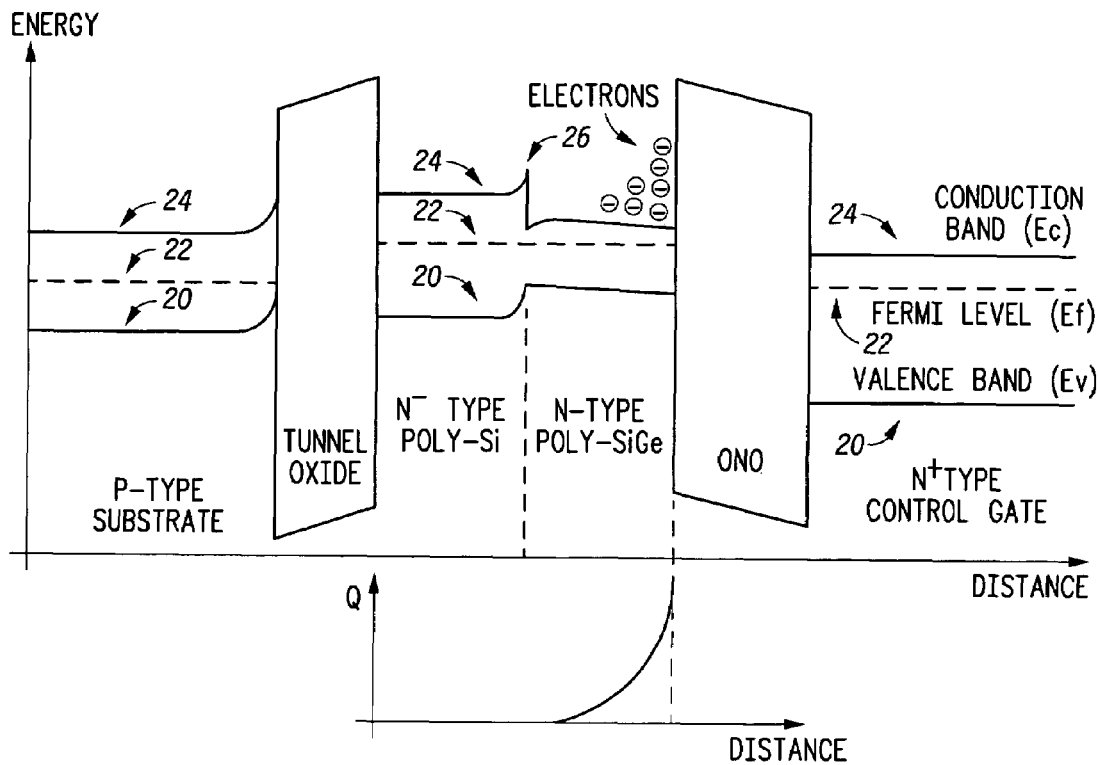
FIG. 3 is a graph illustrating charge storage in the floating gate transistor of FIG. 2.

FIG. 3 is a graph illustrating charge storage in floating gate transistor 30 of FIG. 2 in accordance with the present invention. FIG. 3 includes a valence band 20, Fermi level 22, and a conduction band 24 plotted with Energy on a y-axis versus Distance through the transistor on an x-axis. The valence band 20 indicates the energy for holes in the device and conduction band 24 indicates the energy for the electrons. The Fermi level 22 shows the electro-chemical potential of the holes and electrons in the device. Where the Fermi level 22 is relatively closer to the conduction band 24, electrons are more likely to reside. A graph of charge versus distance is shown below the floating gate in FIG. 1 to illustrate charge storage at the interface between the floating gate and the dielectric layer where the Fermi level 22 is closer to the conduction band 24.

Referring now to both FIG. 2 and FIG. 3, floating gate 36 is constructed to insure that the conduction band 24 in the floating gate is closer to the Fermi level 22 in the portion of floating gate 36 that is closer to the interface between floating gate 36 and dielectric layer 42. Note that layer 40 has a lower bandgap than layer 38. Bandgap is defined as the energy difference between the conduction band 24 and the valence band 20. Point 26 in FIG. 3 illustrates the junction between layer 38 and layer 40 and the bandgap difference from layer 38 to layer 40. Moving the conduction band 24 closer to the Fermi level 22 causes electrons to accumulate closer to the interface as shown in FIG. 3. For purposes of the invention, the bandgap difference can be relatively small, for example, 40 millielectron volts. Because Fermi level 22 is closer to conduction band 24 in layer 40, most of the stored charge will reside in layer 40 as illustrated in FIG. 3.

Moving charge storage in the floating gate away from the tunnel oxide reduces the possibility of charge leakage across the tunnel oxide. Also, the tunnel oxide thickness may be reduced, making it possible to use a lower program voltage. In addition, the program/erase circuits can be reduced in size, resulting in a smaller integrated circuit.

Figure 4:
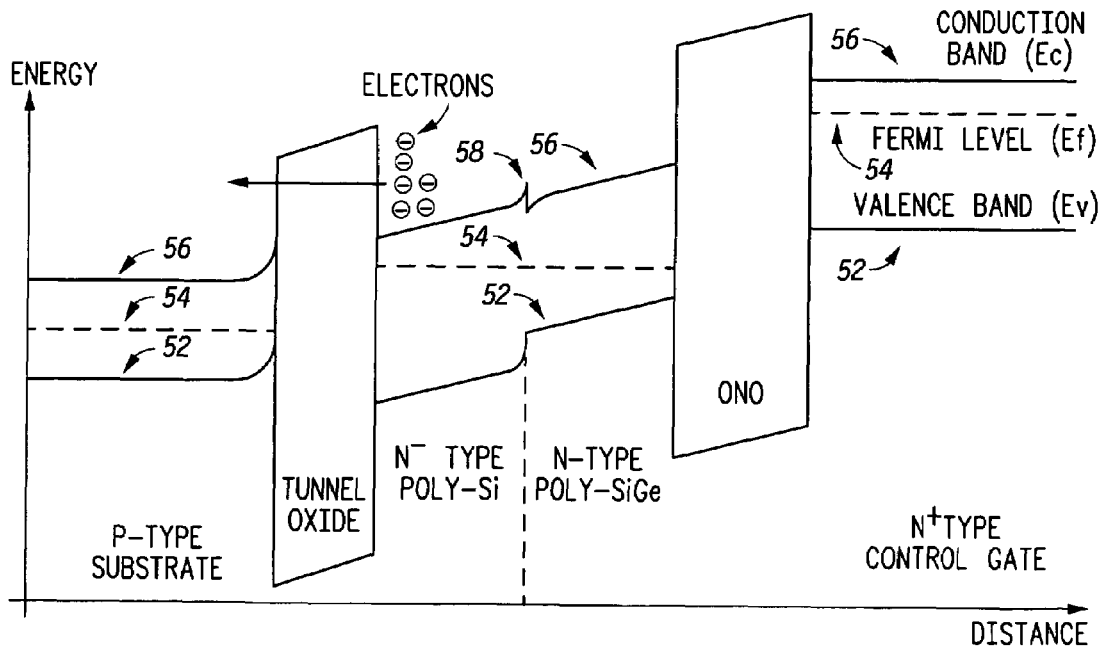
FIG. 4 is a graph illustrating charge movement during an erase operation of the floating gate transistor of FIG. 2.

FIG. 4 is a graph illustrating charge movement and the energy bands during an erase operation of floating gate transistor 30 of FIG. 2. When a voltage is applied to control gate 50 of floating gate transistor 30 during an erase operation, the energy of conduction band 54 is increased so that the stored electrons can relatively easily overcome the energy barrier shown at point 58 between layers 38 and 40 and move to the interface with tunnel oxide 34. The erase operation requires approximately the same voltages required by prior art non-volatile memory cells having a contiguous evenly doped floating gate structure.

In an alternative embodiment, floating gate 36 can be replaced with an insulating film comprising, for example silicon nitride, as in a semiconductor-oxide-nitride-oxide-semiconductor (SONOS) device. The charge is stored in "traps" in the insulating film. The insulating film may have two layers. One of the two layers corresponds to the bottom layer 38 and the other layer corresponds to top layer 40 of the floating gate embodiment shown in FIG. 3. The "trap" density of the top layer is greater than the "trap" density of bottom layer, so that the top layer stores more charge than the bottom layer. In one embodiment, the bottom layer comprises Jet Vapor Deposited silicon nitride (JVD nitride) which is known to have relatively fewer electron trap sites. The top layer comprises Chemical Vapor Deposited silicon nitride (CVD nitride) which is known to have relatively more electron trap sites. This structure stores most of the charge away from the interface with tunnel oxide 34, resulting in improved data retention in accordance with the present invention.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

What is claimed is:

1. A non-volatile memory cell comprising:
   a semiconductor substrate;
   a tunnel oxide formed over the semiconductor substrate;
   a floating gate formed over the tunnel oxide comprising a plurality of charge, a first layer comprising silicon and having a depletion region and a second layer comprising silicon and germanium and having an accumulation region, wherein the accumulation region stores a greater concentration of the plurality of charge than the depletion region;
   an insulating layer formed on the floating gate, wherein the insulating layer is in physical contact with the accumulation region, and the depletion region is between the accumulation region and the tunnel oxide; and
   a control gate formed over the insulating layer, wherein most of the plurality of charge is stored at an interface between the floating gate and the insulating layer, and away from the tunnel oxide.

2. The non-volatile memory cell of claim 1, wherein the first layer is a material with a higher bandgap than the second material.

3. The non-volatile memory cell of claim 1, wherein the greater concentration of charge is at least a majority of charge.

4. The non-volatile memory cell of claim 3, wherein the depletion region stores substantially none of the plurality of charge.

5. The non-volatile memory cell of claim 1, wherein the depletion region comprises a first dopant concentration and the accumulation region comprises a second dopant concentration, wherein the second dopant concentration is greater than the first dopant concentration.

6. The non-volatile memory cell of claim 1, wherein the insulating layer is an oxide-nitride-oxide stack.

\* \* \* \* \*